(12) United States Patent
Onozawa

(10) Patent No.: US 10,490,646 B2
(45) Date of Patent: Nov. 26, 2019

(54) SEMICONDUCTOR DEVICE AND SEMICONDUCTOR DEVICE MANUFACTURING METHOD

(71) Applicant: FUJI ELECTRIC CO., LTD., Kanagawa (JP)

(72) Inventor: Yuichi Onozawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/249,473

(22) Filed: Aug. 29, 2016

(65) Prior Publication Data

US 2017/0018434 A1    Jan. 19, 2017

Related U.S. Application Data

(63) Continuation-in-part of application No. PCT/JP2015/072880, filed on Aug. 12, 2015.

(30) Foreign Application Priority Data

Sep. 30, 2014    (JP) .................... 2014-201065

(51) Int. Cl.
*H01L 29/66* (2006.01)
*H01L 29/10* (2006.01)
(Continued)

(52) U.S. Cl.
CPC .... *H01L 29/66348* (2013.01); *H01L 21/2225* (2013.01); *H01L 21/2253* (2013.01);
(Continued)

(58) Field of Classification Search
CPC ... H01L 21/265; H01L 21/28; H01L 21/3003; H01L 21/324; H01L 29/0638;
(Continued)

(56) References Cited

U.S. PATENT DOCUMENTS 5,696,003 A    12/1997  Makita
6,049,108 A *   4/2000  Williams ............ H01L 27/0255
                                                    257/155
(Continued)

FOREIGN PATENT DOCUMENTS

CN    1112287 A    11/1995
CN    102687277 A    9/2012
(Continued)

OTHER PUBLICATIONS

International Search Report for International Application No. PCT/JP2015/072880, issued by the Japan Patent Office dated Oct. 6, 2015.
(Continued)

*Primary Examiner* — Sophia T Nguyen

(57) ABSTRACT

Protons are injected from a back surface side of a semiconductor substrate to repair both defects within the semiconductor substrate and also defects in a channel forming region on a front surface side of the semiconductor substrate. As a result, variation in gate threshold voltage is reduced and leak current when a reverse voltage is applied is reduced. Provided is a semiconductor device including a semiconductor substrate that includes an n-type impurity region containing protons, on a back surface side thereof; and a barrier metal that has an effect of shielding from protons, on a front surface side of the semiconductor substrate.

15 Claims, 14 Drawing Sheets

(51) Int. Cl.
| | |
|---|---|
| *H01L 29/732* | (2006.01) |
| *H01L 29/423* | (2006.01) |
| *H01L 21/322* | (2006.01) |
| *H01L 21/265* | (2006.01) |
| *H01L 21/324* | (2006.01) |
| *H01L 29/36* | (2006.01) |
| *H01L 29/06* | (2006.01) |
| *H01L 21/30* | (2006.01) |
| *H01L 29/739* | (2006.01) |
| *H01L 29/08* | (2006.01) |
| *H01L 21/22* | (2006.01) |
| *H01L 21/225* | (2006.01) |
| *H01L 29/45* | (2006.01) |
| *H01L 29/49* | (2006.01) |
| *H01L 29/40* | (2006.01) |
| *H01L 29/737* | (2006.01) |
| *H01L 29/32* | (2006.01) |
| *H01L 29/417* | (2006.01) |
| *H01L 21/263* | (2006.01) |

(52) U.S. Cl.
CPC .... *H01L 21/26506* (2013.01); *H01L 21/3003* (2013.01); *H01L 21/324* (2013.01); *H01L 21/3223* (2013.01); *H01L 21/3225* (2013.01); *H01L 29/0619* (2013.01); *H01L 29/0638* (2013.01); *H01L 29/0804* (2013.01); *H01L 29/0834* (2013.01); *H01L 29/1004* (2013.01); *H01L 29/105* (2013.01); *H01L 29/1037* (2013.01); *H01L 29/1095* (2013.01); *H01L 29/32* (2013.01); *H01L 29/365* (2013.01); *H01L 29/401* (2013.01); *H01L 29/4236* (2013.01); *H01L 29/456* (2013.01); *H01L 29/4958* (2013.01); *H01L 29/732* (2013.01); *H01L 29/7373* (2013.01); *H01L 29/7397* (2013.01); *H01L 21/263* (2013.01); *H01L 29/0821* (2013.01); *H01L 29/41708* (2013.01); *H01L 29/42304* (2013.01); *H01L 2924/13055* (2013.01)

(58) Field of Classification Search
CPC ........... H01L 29/1095; H01L 29/41708; H01L 29/66348; H01L 29/739; H01L 29/7397; H01L 29/78; H01L 29/0823; H01L 29/732; H01L 29/7371; H01L 29/1307; H01L 29/4236; H01L 29/0804; H01L 29/0821; H01L 29/1004; H01L 29/0832; H01L 29/42304; H01L 29/105; H01L 29/0619; H01L 29/365; H01L 29/3225; H01L 29/401; H01L 29/456; H01L 29/4941; H01L 29/4958; H01L 21/26506; H01L 21/2225; H01L 21/2253; H01L 21/425; H01L 21/0415; H01L 21/3223; H01L 21/3225; H01L 2924/13055; H01L 29/0834; H01L 29/7373; H01L 21/02

See application file for complete search history.

(56) References Cited

U.S. PATENT DOCUMENTS

| | | | | |
|---|---|---|---|---|
| 6,482,681 B1* | 11/2002 | Francis | ............ | H01L 21/26506 |
| | | | | 257/E21.162 |
| 6,855,999 B2* | 2/2005 | Hwang | ............ | H01L 21/76804 |
| | | | | 257/471 |
| 7,459,751 B2 | 12/2008 | Sugiyama | | |
| 8,252,645 B2* | 8/2012 | Hshieh | ............ | H01L 29/7813 |
| | | | | 438/200 |
| 9,368,577 B2* | 6/2016 | Takishita | ............ | H01L 21/263 |
| 9,385,211 B2* | 7/2016 | Miyazaki | ............ | H01L 21/265 |
| 9,520,475 B2* | 12/2016 | Miyazaki | ............ | H01L 29/36 |
| 9,773,873 B1* | 9/2017 | Takahashi | ............ | H01L 29/2003 |
| 2002/0109183 A1* | 8/2002 | Ishimura | ............ | H01L 29/456 |
| | | | | 257/335 |
| 2005/0258541 A1* | 11/2005 | Yanagisawa | ............ | H01L 23/5226 |
| | | | | 257/751 |
| 2007/0096167 A1* | 5/2007 | Francis | ............ | H01L 29/0834 |
| | | | | 257/262 |
| 2008/0001257 A1* | 1/2008 | Schulze | ............ | H01L 29/7396 |
| | | | | 257/565 |
| 2008/0054369 A1* | 3/2008 | Schulze | ............ | H01L 29/0834 |
| | | | | 257/378 |
| 2008/0315250 A1* | 12/2008 | Onozawa | ............ | H01L 29/0834 |
| | | | | 257/139 |
| 2009/0184340 A1 | 7/2009 | Nemoto et al. | | |
| 2010/0240213 A1* | 9/2010 | Urano | ............ | H01L 21/288 |
| | | | | 438/652 |
| 2010/0244093 A1* | 9/2010 | Rahimo | ............ | H01L 29/0834 |
| | | | | 257/142 |
| 2010/0327313 A1* | 12/2010 | Nakamura | ............ | H01L 29/0834 |
| | | | | 257/133 |
| 2012/0146090 A1* | 6/2012 | Lui | ............ | H01L 29/0834 |
| | | | | 257/139 |
| 2012/0267681 A1* | 10/2012 | Nemoto | ............ | H01L 21/263 |
| | | | | 257/139 |
| 2014/0117502 A1 | 5/2014 | Laven | | |
| 2014/0217407 A1* | 8/2014 | Mizushima | ............ | H01L 29/32 |
| | | | | 257/48 |
| 2014/0246750 A1* | 9/2014 | Takishita | ............ | H01L 21/263 |
| | | | | 257/493 |
| 2014/0246755 A1* | 9/2014 | Yoshimura | ............ | H01L 29/32 |
| | | | | 257/617 |
| 2014/0291723 A1* | 10/2014 | Miyazaki | ............ | H01L 29/36 |
| | | | | 257/139 |
| 2014/0357026 A1* | 12/2014 | Kobayashi | ............ | H01L 29/7397 |
| | | | | 438/135 |
| 2015/0024556 A1* | 1/2015 | Miyazaki | ............ | H01L 29/32 |
| | | | | 438/138 |
| 2015/0050798 A1* | 2/2015 | Kobayashi | ............ | H01L 29/7397 |
| | | | | 438/475 |
| 2015/0069462 A1* | 3/2015 | Mizushima | ............ | H01L 29/36 |
| | | | | 257/139 |
| 2015/0179441 A1* | 6/2015 | Onozawa | ............ | H01L 29/36 |
| | | | | 257/109 |
| 2015/0228723 A1* | 8/2015 | Werber | ............ | H01L 29/0619 |
| | | | | 257/140 |
| 2015/0287786 A1* | 10/2015 | Jeon | ............ | H01L 29/0615 |
| | | | | 257/139 |
| 2015/0311279 A1* | 10/2015 | Onozawa | ............ | H01L 29/66333 |
| | | | | 257/139 |
| 2016/0163654 A1* | 6/2016 | Nakanishi | ............ | H01L 23/552 |
| | | | | 257/140 |
| 2016/0204236 A1* | 7/2016 | Torii | ............ | H01L 29/7397 |
| | | | | 257/139 |
| 2016/0276446 A1* | 9/2016 | Wakimoto | ............ | H01L 29/78 |
| 2016/0284825 A1* | 9/2016 | Onozawa | ............ | H01L 29/0623 |
| 2016/0315140 A1* | 10/2016 | Iwasaki | ............ | H01L 29/32 |
| 2016/0329323 A1* | 11/2016 | Iwasaki | ............ | H01L 29/32 |
| 2016/0372541 A1* | 12/2016 | Onozawa | ............ | H01L 29/0619 |
| 2017/0018434 A1* | 1/2017 | Onozawa | ............ | H01L 21/265 |
| 2017/0047408 A1* | 2/2017 | Kuribayashi | ............ | H01L 21/265 |
| 2017/0069625 A1* | 3/2017 | Hirabayashi | ............ | H01L 27/04 |
| 2017/0194438 A1* | 7/2017 | Kumagai | ............ | H01L 29/1608 |
| 2017/0271447 A1* | 9/2017 | Tamura | ............ | H01L 29/0834 |
| 2017/0278929 A1* | 9/2017 | Imagawa | ............ | H01L 29/7397 |
| 2017/0317163 A1* | 11/2017 | Yoshimura | ............ | H01L 29/063 |
| 2017/0345888 A1* | 11/2017 | Takishita | ............ | H01L 29/36 |
| 2018/0005829 A1* | 1/2018 | Takishita | ............ | H01L 21/265 |
| 2018/0012762 A1* | 1/2018 | Mukai | ............ | H01L 21/221 |

FOREIGN PATENT DOCUMENTS

| | | |
|---|---|---|
| CN | 103946983 A | 7/2014 |
| CN | 103946985 A | 7/2014 |
| JP | 2008-078397 A | 4/2008 |
| JP | 2009-176892 A | 8/2009 |

(56) References Cited

FOREIGN PATENT DOCUMENTS

| | | |
|---|---|---|
| JP | 2013-102111 A | 5/2013 |
| JP | 2014-049694 A | 3/2014 |
| JP | 2014-158041 A | 8/2014 |
| WO | 2010-041740 A1 | 4/2010 |

OTHER PUBLICATIONS

Office Action issued for counterpart Japanese Application 2016-551618, issued by the Japan Patent Office dated Jul. 18, 2017.
Office Action issued for counterpart Chinese Application 201580011602.X, issued by the National Intellectual Property Administration, PRC dated Sep. 13, 2018.

\* cited by examiner

SEMICONDUCTOR DEVICE AND SEMICONDUCTOR DEVICE MANUFACTURING METHOD

The contents of the following Japanese patent applications are incorporated herein by reference:
NO. 2014-201065 filed in JP on Sep. 30, 2014, and
NO. PCT/JP2015/072880 filed on Aug. 12, 2015.

BACKGROUND

1. Technical Field

The present invention relates to a semiconductor device and a semiconductor device manufacturing method.

2. Related Art

Conventional art is known for forming an aluminum electrode on a barrier metal layer, as an emitter electrode of an insulated gate bipolar transistor (referred to hereinafter as an IGBT), as shown in paragraph 0027 of Patent Document 1, for example. Furthermore, a technique is known for ameliorating crystal defects by injecting protons into a semiconductor substrate and then annealing the semiconductor substrate, as shown in Patent Document 2, for example. In addition, it is known that, by injecting protons into a semiconductor substrate and then annealing the semiconductor substrate, the vacancy (V), oxygen (O), and Hydrogen (H) form VOH defects and these VOH defects act as donors that supply electrons, as shown in Patent Document 2, for example.

Patent Document 1: Japanese Patent Application Publication No. 2006-080110
Patent Document 2: International Publication WO 2013/100155

A barrier metal used for an emitter electrode has an effect of shielding the semiconductor substrate from the protons being injected thereto. Therefore, even when protons are injected into the semiconductor substrate through the barrier metal and thermal processing is performed, a sufficient amount of defects are not repaired. Therefore, proposals have been made to repair the defects by, before the barrier metal is formed, injecting protons into the semiconductor substrate from the front surface side of the semiconductor substrate where the emitter electrode is provided and performing thermal processing, and then repairing defects by injecting protons into the semiconductor substrate from the back surface of the semiconductor substrate where the collector electrode is provided and performing thermal processing. However, when the number of thermal processes performed after proton injection increases, the manufacturing cost also increases.

SUMMARY

According to a first aspect of the present invention, provided is a semiconductor device comprising a semiconductor substrate and a barrier metal. The semiconductor substrate may include an n-type impurity region containing protons, on a back surface side thereof. The barrier metal may have an effect of shielding from protons, on a front surface side of the semiconductor substrate. Protons spread from the n-type impurity region may repair defects remaining within the semiconductor substrate. Protons spread from the n-type impurity region may terminate dangling bonds at a boundary surface between the gate insulating film and the semiconductor substrate. In other words, hydrogen atoms may be present at the boundary surface between the gate insulating film and the semiconductor substrate.

The n-type impurity region may have a plurality of peaks in the carrier concentration, at positions of different depths between the back surface side and the front surface side. The n-type impurity region may include a first impurity region and a second impurity region. The first impurity region may have an impurity region with a predetermined carrier concentration. The second impurity region may have a carrier concentration lower than the predetermined carrier concentration. The second impurity region may be provided closer to the back surface than the first impurity region. The n-type impurity region may include first to fourth impurity regions from the front surface side to the back surface side. The carrier concentration of the first impurity region may be greater than the carrier concentration of the second impurity region, the carrier concentration of the first impurity region may be equal to the carrier concentration of the third impurity region, and the carrier concentration of the fourth impurity region may be greater than the carrier concentration of the first impurity region.

A gate electrode may be further included on the front surface side of the semiconductor substrate. A gate insulating film may be further included between the gate electrode and the semiconductor substrate. Hydrogen atoms may be present at a boundary plane between the gate insulating film and the semiconductor substrate.

According to a second aspect of the present invention, provided is a semiconductor device manufacturing method comprising forming a barrier metal, forming an impurity region, and performing thermal processing. The forming the barrier metal may include having an effect of shielding from protons, on a front surface side of a semiconductor substrate. The forming the impurity region may include injecting protons from the back surface side of the semiconductor substrate. The performing thermal processing may include thermally processing the semiconductor substrate into which the protons have been injected.

The forming the impurity region may include, while changing injection conditions that include an acceleration voltage and an injection amount per unit area, injecting protons a plurality of times at positions of different depths. The forming the impurity region may include performing a first instance of proton injection and performing a second instance of proton injection. The performing the first instance of proton injection may include an impurity region with a predetermined carrier concentration. The performing the second instance of proton injection may include changing an injection condition in a manner to make the carrier concentration lower than the predetermined carrier concentration and forming an impurity region closer to the back surface than the impurity region formed by the first instance of proton injection.

The forming the impurity region may further include performing a third instance of proton injection and performing a fourth instance of proton injection. The performing the third instance of proton injection may include forming an impurity region closer to the back surface than the impurity region formed by the second instance of proton injection. The performing the fourth instance of proton injection may include forming an impurity region closer to the back surface than the impurity region formed by the third instance of proton injection. With injection amounts per unit area in the first instance, the second instance, the third instance, and the fourth instance of proton injection set as $N_1$, $N_2$, $N_3$, and $N_4$, a relationship of $N_2<N_1 \approx N_3<N_4$ may be satisfied.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention. Furthermore, in the descriptions in this Specification, the symbol E in the term 1E+15 indicates 10 raised to a certain power, e.g. 1E+15 means $1 \times 10^{15}$.

Figure 1:
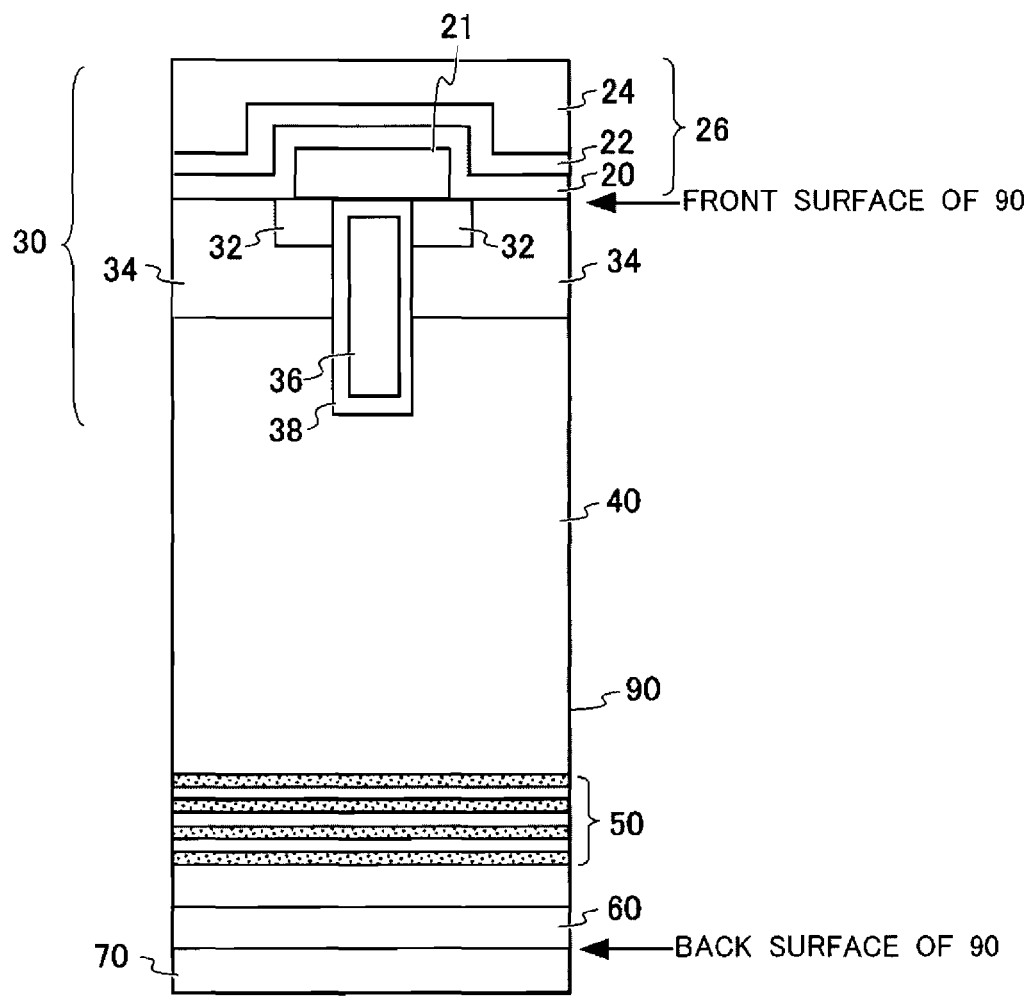
FIG. 1 shows an exemplary configuration of a semiconductor device 100.

FIG. 1 shows an exemplary configuration of a semiconductor device 100. FIG. 1 shows a cross section of the semiconductor device 100 obtained by cutting the semiconductor device 100 in a direction transecting a gate electrode 36. The semiconductor device 100 includes a plurality of IGBT elements and other elements, but only one IGBT is shown in FIG. 1.

The semiconductor device 100 includes a MOS gate structure 30 on the front surface side of the semiconductor substrate 90, and includes a p-n junction on the back surface side of the semiconductor substrate 90. In this Specification, the front surface of the semiconductor substrate 90 refers to the surface on which an emitter electrode 26 is formed, and the back surface of the semiconductor substrate 90 refers to the surface on which a collector electrode 70 is formed. Furthermore, the front surface side refers to a plane closer to the front surface of the semiconductor substrate 90, and the back surface side refers to a plane closer to the back surface of the semiconductor substrate 90. For example, the front surface side of a second conduction type region 34 is the boundary plane between the second conduction type region 34 and a first metal nitride layer 22, and the back surface side of the second conduction type region 34 is the boundary plane between the second conduction type region 34 and a base layer 40.

The semiconductor device 100 includes the semiconductor substrate 90, the emitter electrode 26 and an interlayer insulating film 21 provided on the front surface side of the semiconductor substrate 90, and a collector electrode 70 provided on the back surface side of the semiconductor substrate 90. The semiconductor substrate 90 includes a first conduction type region 32, the second conduction type region 34, the gate electrode 36, a gate insulating film 38, the base layer 40, an FS layer 50, and a collector layer 60.

The MOS gate structure 30 includes the emitter electrode 26, the interlayer insulating film 21, the first conduction type region 32, the second conduction type region 34, the gate electrode 36, and the gate insulating film 38. In the second conduction type region 34, the boundary plane with the gate insulating film 38, which is a boundary plane that is opposite the gate electrode 36 in a manner to sandwich the gate insulating film 38, is a channel forming region. The channel forming region is a region where an n-type inversion layer is formed in the gate electrode 36 when a voltage greater than or equal to the threshold value of the MOS gate is applied. The emitter electrode 26 includes a first metal layer 20, a first metal nitride layer 22, and a second metal layer 24. The first metal layer 20 and the first metal nitride layer 22 form the barrier metal for the second metal layer 24. The first metal layer 20 and the first metal nitride layer 22 serving as the barrier metal reduce the contact resistance between the second metal layer 24 and the first conduction type region 32. Furthermore, the barrier metal improves the coverage of the emitter electrode 26.

In this example, the first metal layer 20 is a titanium layer, the first metal nitride layer 22 is a titanium nitride layer, and the second metal layer 24 is an aluminum layer. In another example, the first metal layer 20 may be a tantalum layer and the first metal nitride layer 22 may be a tantalum nitride layer.

The barrier metal has a function to prevent the metal material from spreading into the semiconductor substrate 90. Furthermore, the barrier metal, when provided on the front surface side of the semiconductor substrate 90, has an effect of shielding the semiconductor substrate 90 from protons ($H^+$ ions) injected into the semiconductor substrate 90 from the front surface side.

The MOS gate structure 30 of this example has a so-called trench gate structure. In this example, the first conduction type region 32 is an $n^+$-type region formed on the front surface side of the base layer 40. The second conduction type region 34 is a p-type region that is formed in a manner to surround the first conduction type region 32 and distance the first conduction type region 32 and the base layer 40 from each other. When a prescribed voltage is applied to the gate electrode 36, a channel is formed between the gate insulating film 38 and the second conduction type region 34, and conduction occurs between the first conduction type region 32 and the base layer 40. In this way, the MOS gate structure 30 operates as a MOSFET.

The base layer 40 is a semiconductor layer of a first conduction type. The base layer 40 of this example is an n-type silicon layer. The base layer 40 functions as a drift layer when the MOS gate structure 30 operates as a MOSFET.

The FS layer 50 has the first conduction type and is formed on the back surface side of the base layer 40. The FS layer 50 is formed near the back surface side of the semiconductor substrate 90. The FS layer 50 is a field stop layer that stops the expansion of the depletion layer when a reverse voltage is applied.

The FS layer 50 has an n-type impurity region including protons. The n-type impurity region is an $n^+$-type region formed by injecting protons and performing thermal processing. The n-type impurity region has a plurality of peaks in the carrier concentration, at positions of different depths between the back surface side and the front surface side of the semiconductor substrate 90. By injecting protons from the back surface side a plurality of times at different acceleration voltages, it is possible to adjust the proton injection position. Furthermore, by injecting the protons while changing the injection amount per unit area at the different depth positions a plurality of times, it is possible to adjust the impurity concentration according to the proton injection position. The proton injection step is performed before the step of forming the collector layer 60 and the collector electrode 70.

In a case where the semiconductor substrate 90 is a silicon wafer, the semiconductor substrate 90 includes a certain amount of oxygen. For example, an FZ wafer includes approximately from $1E+15$ $cm^{-3}$ to $1E+16$ $cm^{-3}$ of oxygen. As another example, a CZ wafer includes approximately from $1E+16$ $cm^{-3}$ to $1E+17$ $cm^{-3}$ of oxygen. The semiconductor substrate 90 includes a vacancy (V) therein caused by proton injection, electron beam irradiation, or the like. By thermally processing (annealing) the semiconductor substrate 90 that includes the vacancy (V), oxygen (O), and hydrogen (H), VOH defects are formed in the FS layer 50. The VOH defects are donors that supply electrons.

As a result, the n-type impurity region of the FS layer 50 functions as a field stop layer. Accordingly, it is possible to prevent the depletion layer from expanding beyond the FS layer 50 when the reverse voltage is applied. In this way, it is possible to reduce the leakage current when the reverse voltage is applied.

Not all of the protons injected into the semiconductor substrate 90 contribute to the formation of VOH defects. Specifically, a portion of the protons injected into the semiconductor substrate 90 spread within the semiconductor substrate 90. For example, a portion of the injected protons spread to the front surface side of the semiconductor substrate 90.

The protons that have spread to the front surface side repair the defects within the semiconductor substrate 90. For example, the protons that have spread from the back surface side to the front surface side can repair crystal defects of the second conduction type region 34 near the gate insulating film 38. In other words, it is possible to repair the crystal defects in the channel forming region of the IGBT. Furthermore, it is also possible to repair the defects (etching damage) of the second conduction type region 34 and the base layer 40 that occurs when forming the trench to be provided with the gate electrode 36. In this way, it is possible to reduce the variation in the gate threshold voltage (Vth) between each IGBT.

The collector layer 60 is provided at an end of the back surface side of the semiconductor substrate 90. The collector layer 60 has a second conduction type. The collector layer 60 of this example is a $p^+$-type silicon layer. The first conduction type region 32, the second conduction type region 34, the base layer 40, the FS layer 50, and the collector layer 60 are formed of the same material (silicon in this example).

The collector electrode 70 is formed on the back surface side of the collector layer 60. The collector electrode 70 is formed by vapor-depositing or sputtering aluminum on the back surface side of the collector layer 60, for example.

Figure 2:
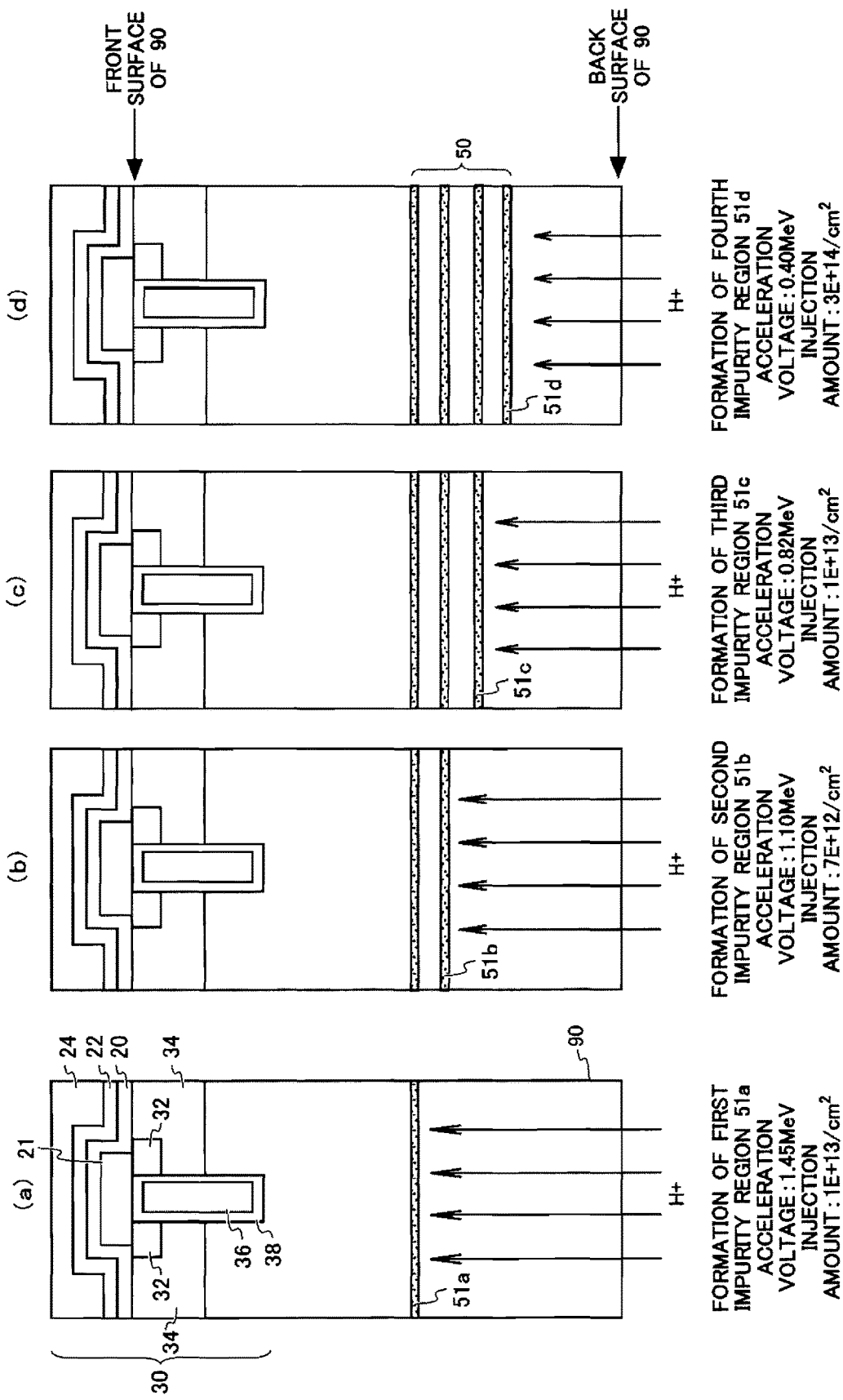
FIG. 2 shows steps (a) to (d) for forming first to fourth impurity regions in the FS layer 50.

FIG. 2 shows steps (a) to (d) for forming first to fourth impurity regions in the FS layer 50. The n-type impurity region in the FS layer 50 of this example includes a first impurity region 51a to a fourth impurity region 51d. The first impurity region 51a to fourth impurity region 51d are examples, and the n-type impurity region may include five or more impurity regions. Among the n-type impurity regions, the first impurity region 51a is positioned closest to the front surface. The second impurity region 51b is positioned closer to the back surface than the first impurity region 51a. The third impurity region 51c is positioned closer to the back surface than the second impurity region 51b, and the fourth impurity region 51d is positioned closer to the back surface than the third impurity region 51c.

In this example, after the MOS gate structure 30 has been formed, the protons are injected from the back surface of the semiconductor substrate 90. First, a first instance of proton injection is performed with an acceleration voltage of 1.45 MeV and an injection amount per unit area of $1E+13/cm^2$. Next, the injection conditions are changed to an acceleration voltage of 1.10 MeV and an injection amount per unit area of $7E+12/cm^2$, and a second instance of proton injection is performed at a position closer to the back surface than the position where the first instance of proton injection was performed. By setting the injection amount in the first instance of proton injection to be greater than the injection amount in the second instance of proton injection, it is possible to cause the protons to spread to a position near the front surface side of the semiconductor substrate 90 during the thermal processing. In this way, it is possible to also repair defects on the front surface side.

In this example, the protons spread to a position near the front surface side of the semiconductor substrate 90 to repair defects, and therefore the first instance of proton injection is preferably performed at a position as close to the front surface side as possible. However, the protons must be injected with a higher acceleration voltage when being injected to a position closer to the front surface side. In accordance with the acceleration voltage becoming higher, the defects in the semiconductor substrate 90 caused by the proton injection increase. Furthermore, in accordance with the acceleration voltage becoming higher, variation in the injection amount in the depth direction becomes greater, and therefore it is difficult to control the injection amount at a specified depth. Therefore, the first instance of proton injection, which is closest to the front surface side, should be performed at a suitable position that is at a distance of 20 μm to 70 μm from the channel forming region toward the back surface side, for example.

Next, a third instance of proton injection is performed at a position closer to the back surface than the position where the second instance of proton injection was performed by changing the injection conditions are changed to an acceleration voltage of 0.82 MeV and an injection amount per unit area of $1E+13/cm^2$. Finally, the injection conditions are changed to an acceleration voltage of 0.40 MeV and an injection amount per unit area of $3E+14/cm^2$, and a fourth instance of proton injection is performed at a position closer to the back surface than the position where the third instance of proton injection was performed. In this way, proton injection is performed at positions of different depths between the back surface side and the front surface side.

In the proton injection step, when the injection amounts per unit area in the first instance, the second instance, the third instance, and the fourth instance of proton injection are set as $N_1$, $N_2$, $N_3$, and $N_4$, the relationship of $N_2<N_1\approx N_3<N_4$ is satisfied. In this Specification, $N_1\approx N_3$ means that $N_1$ and $N_3$ are approximately equal. In this example, $N_1=N_3=1E+13/cm^2$. After the proton injection has been finished, the semiconductor substrate 90 is thermally processed and the first to fourth impurity regions, which are n-type impurity regions, are formed. In this way, the FS layer 50 is completed.

The injection amount $N_1$ per unit area in the first instance of proton injection is greater than $N_2$, and this injection amount may be greater than or equal to $1E+12/cm^2$ and less than or equal to $1E+14/cm^2$, or more specifically may be greater than or equal to $3E+12/cm^2$ and less than or equal to $3E+13/cm^2$. The first impurity region 51a may be completely depleted in response to the application of voltage to the IGBT when the gate is OFF. In order to achieve this, the integrated value of the carrier concentration from the second conduction type region 34 to the boundary between the first impurity region 51a and the second impurity region 51b may at least be less than the critical integrated concentration $n_c$, preferably less than half of the critical integrated concentration $n_c$.

Here, the critical integrated concentration $n_c$ is as described below. A value of the electric field strength at which an avalanche breakdown occurs is referred to as the critical electric field strength. The avalanche breakdown depends on the elements forming the semiconductor, the impurities used to dope the semiconductor, and the concentration of the impurities. With the donor concentration set as $N_D$ and the critical electric field strength set as $E_c$, when ionization is integrated using the impact ionization coefficient of silicon (Si), the critical electric field strength $E_c$ is represented as shown in Expression 1.

$$Ec=4010\cdot(N_D)^{1/8} \qquad \text{Expression 1:}$$

As understood from Expression 1, if the donor concentration $N_D$ is determined, then the critical electric field strength $E_c$ is determined. Furthermore, when considering only one dimensional direction (set as the x direction), Poisson's equation is as shown in Expression 2.

$$dE/dx=(q/\varepsilon_r\varepsilon_0)(p-n+N_D-N_A) \qquad \text{Expression 2:}$$

Here, q is the elementary charge ($1.062\times10^{15}$ [C]), $\varepsilon_0$ is the permittivity in a vacuum ($8.854\times10^{-14}$ [F/cm]), and $\varepsilon_r$ is the dielectric constant of the material. In the case of silicon, $\varepsilon_r=11.9$. Furthermore, p is the positive hole concentration, n is the electron concentration, and $N_A$ is the acceptor concentration. Only the n-type layer at the stepped junction on one side is considered, and therefore no acceptors are present ($N_A=0$). Furthermore, when it is assumed that the depletion layer is completely depleted such that no positive holes or electrons are present (n=p=0), Expression 3 can be obtained by integrating Expression 2 for the depth x.

$$E=(q/\varepsilon_r\varepsilon_0)\int N_D dx \qquad \text{Expression 3:}$$

The position of the p-n junction is set as the origin 0 and the position of the end of the depletion layer on the side opposite the p-n junction in the n-type layer is set as $x_0$. When the entire depletion layer is integrated from 0 to $x_0$, E in Expression 3 is the maximum value of the electric field strength distribution. With this value set as $E_m$, $E_m$ is expressed as shown in Expression 4.

$$E_m=(q/\varepsilon_r\varepsilon_0)\int_0^{x_0} N_D dx \qquad \text{Expression 4:}$$

When the maximum value $E_m$ of the electric field strength distribution reaches the critical electric field strength $E_c$, Expression 4 is as shown in Expression 5.

$$E_c(\varepsilon_r\varepsilon_0/q)=\int_0^{x_0} N_D dx \qquad \text{Expression 5:}$$

Both sides of Expression 5 are constants. The right side of Expression 5 is the range across which the n-type layer is completely depleted, and therefore is represented as the critical integrated concentration $n_c$, as defined by the description in this Specification. Therefore, Expression 6 shown below can be obtained. Expression 6 shows the correspondence between the critical integrated concentration $n_c$ and the critical electric field strength $E_c$. In this way, the critical integrated concentration $n_c$ becomes a constant corresponding to the critical electric field strength $E_c$.

$$E_c(\varepsilon_r\varepsilon_0/q)=n_c \qquad \text{Expression 6:}$$

In the above calculation, a state is assumed in which the donor concentration $N_D$ has a uniform distribution in the x direction of the n-type layer. Since the critical electric field strength $E_c$ depends on the donor concentration $N_D$ of the n-type layer (Expression 5), the critical integrated concentration $n_c$ also depends on the donor concertation $N_D$ of the n-type layer. When the donor concentration ND is in a range from $1\times10^{13}(/cm^3)$ to $1\times10^{15}(/cm^3)$, the critical integrated concentration $n_c$ is in a range from $1.1\times10^{12}(/cm^3)$ to $2.0\times10^{12}(/cm^3)$. In light of the donor concentration being within a range spanning several orders of magnitude, the critical integrated concentration $n_c$ can be treated as being approximately a constant.

For example, in a case where the rated voltage of the semiconductor device 100 of the present embodiment is 1,200 V, when the donor concentration of the base layer 40 is set to $6.1\times10^{13}(/cm^3)$, the critical integrated concentration $n_c$ from Expression 6 can be evaluated as being approximately $1.4\times10^{12}(/cm^3)$. As another example, in a case where the rated voltage is 600 V, when the donor concentration of the base layer 40 is set to $1.4\times10^{14}(/cm^3)$, the critical integrated concentration $n_c$ from Expression 6 can be evaluated as being approximately $1.55\times10^{12}(/cm^3)$. Furthermore, this argument regarding the critical total impurity amount described above is not limited to silicon, and can also be applied to wide-bandgap semiconductors such as silicon carbide (SiC), gallium nitride (GaN), diamond, and gallium oxide ($Ga_2O_3$) semiconductors. Specifically, the respective values of each material should be inserted as the impact ionization coefficient for calculating Expression 1 and as the dielectric constant in Expression 2.

Figure 3:
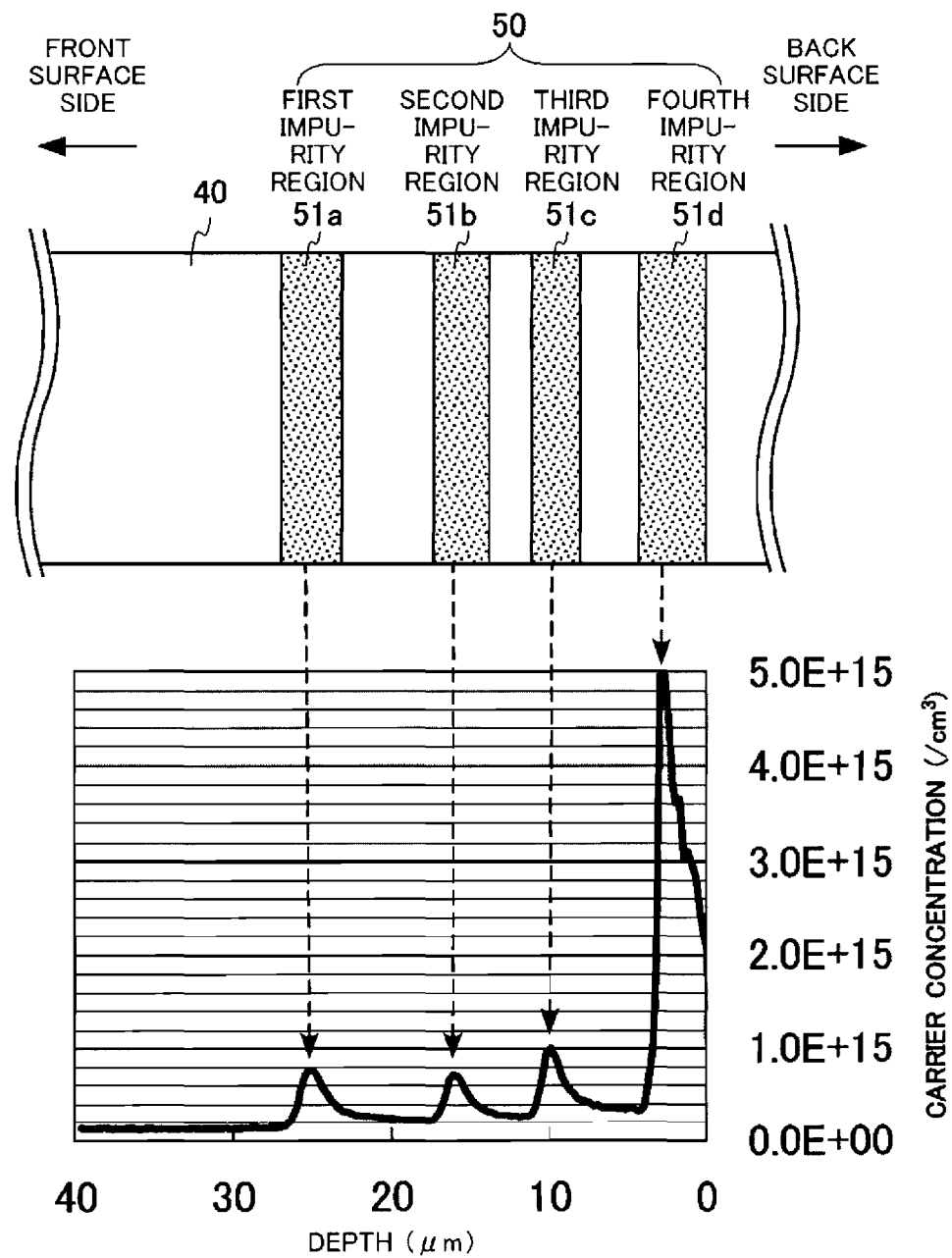
FIG. 3 shows a carrier concentration distribution in the first to fourth impurity regions, after the semiconductor substrate 90 into which the protons have been injected has been thermally processed.

FIG. 3 shows a carrier concentration distribution in the first to fourth impurity regions, after the semiconductor substrate 90 into which the protons have been injected has been thermally processed. The first impurity region 51a has an impurity region with a predetermined carrier concentration. In this example, the first impurity region 51a has a carrier concentration of $0.8E+15/cm^3$. The second impurity region 51b has a carrier concentration that is lower than the predetermined carrier concentration of the first impurity region 51a. In this example, the second impurity region 51b has a carrier concentration of $0.7E+15/cm^3$. The third impurity region 51c has a carrier concentration of $1.0E+15/cm^3$, and the fourth impurity region 51d has a carrier concentration greater than $5.0E+15/cm^3$. In this way, the n-type impurity region of the FS layer 50 has a plurality of peaks in the carrier concentration at positions of different depths in the semiconductor substrate 90.

Figure 4:
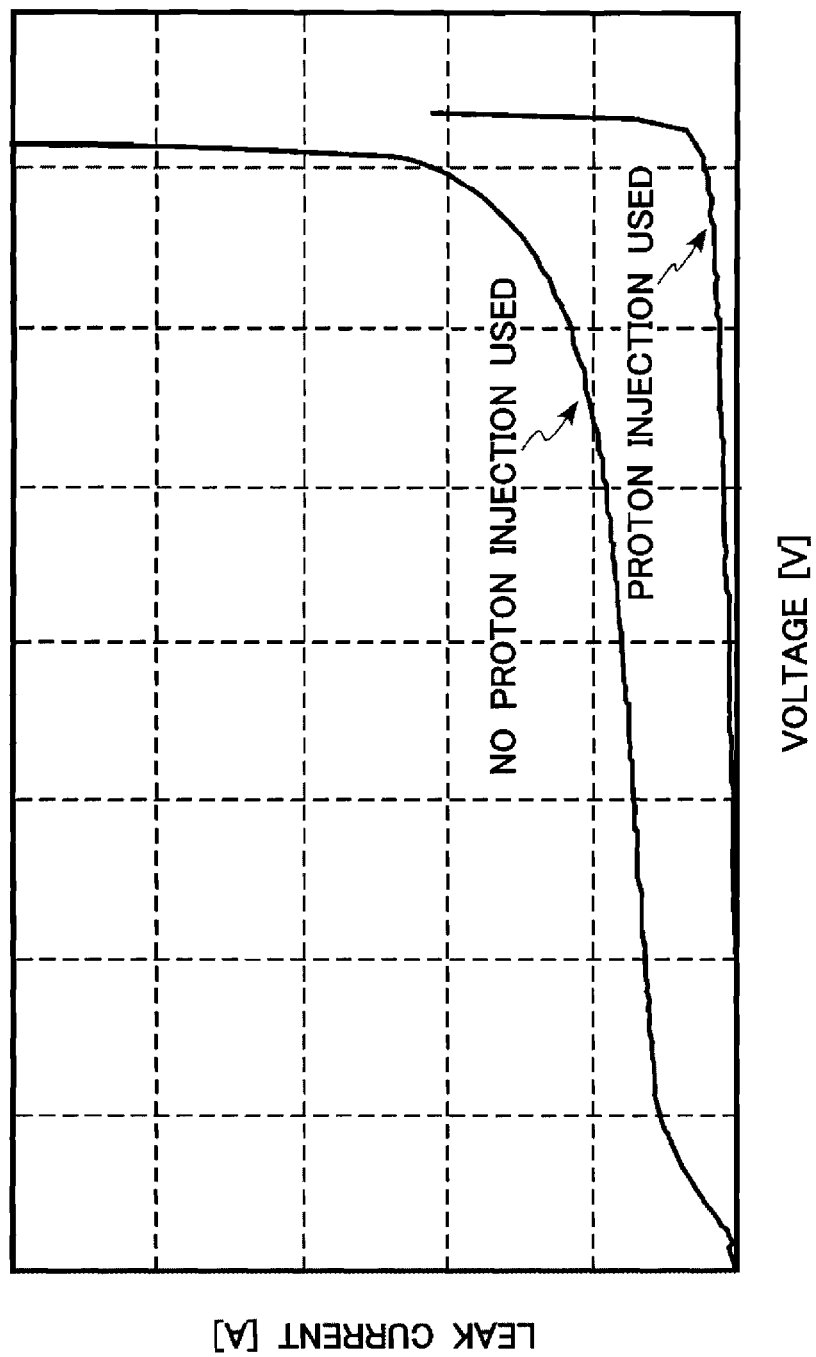
FIG. 4 shows comparison results for the leak current in cases where the FS layer 50 of the present example is present and is not present.

FIG. 4 shows comparison results for the leak current in cases where the FS layer 50 of the present example is present and is not present. The horizontal axis indicates the magnitude of the reverse voltage (V) applied to the IGBT, and the vertical axis indicates the leak current (A). The label "no proton injection used" means that the FS layer was created using a method other than proton injection. For example, there is a case where the FS layer was formed through phosphorous injection. On the other hand, the label "proton injection used" means that the FS layer 50 was created using proton injection such as described in this example. The device including the FS layer 50 of this example has a lower leak current than the device in which the FS layer was formed with a method other than proton injection. This is thought to be due to the effect of the gate threshold value recovering to a prescribed value, as a result of the protons spreading to a position near the front surface side of the semiconductor substrate 90 during thermal processing to repair the defects.

Figure 5A:
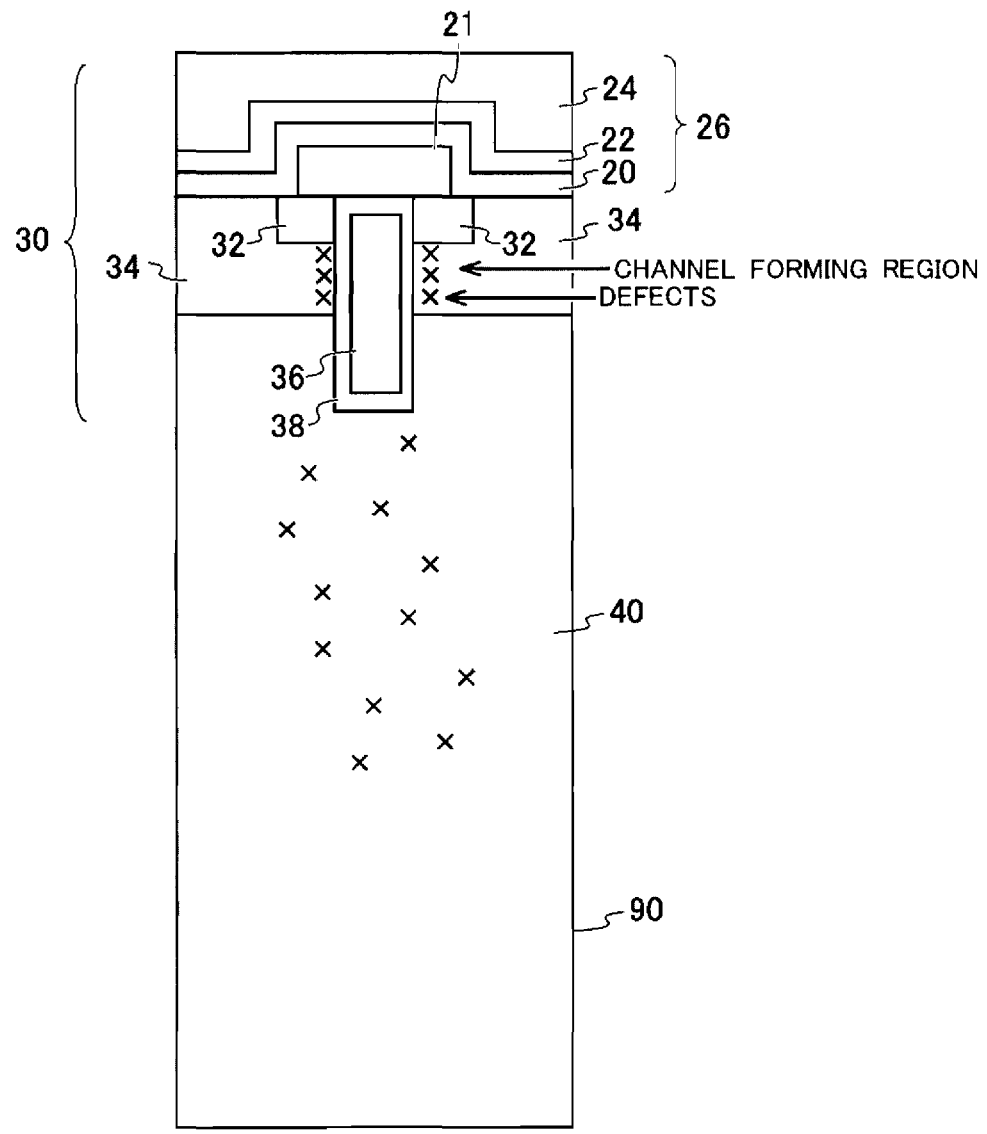
FIG. 5A shows a step of forming the MOS gate structure 30 on the front surface side of the semiconductor substrate 90.

FIGS. 5A to 5F show steps of manufacturing the semiconductor device 100. As shown in FIG. 5A, the MOS gate structure 30 is formed on the front surface side of the semiconductor substrate 90. The step of forming the MOS gate structure 30 includes forming the first metal layer 20 and the first metal nitride layer 22 as the metal barrier on the front surface side of the semiconductor substrate 90. In this step, the channel forming regions include defects that occur when forming the first conduction type region 32, forming the second conduction type region 34, and forming the gate electrode 36 and gate insulating film 38.

Figure 5B:
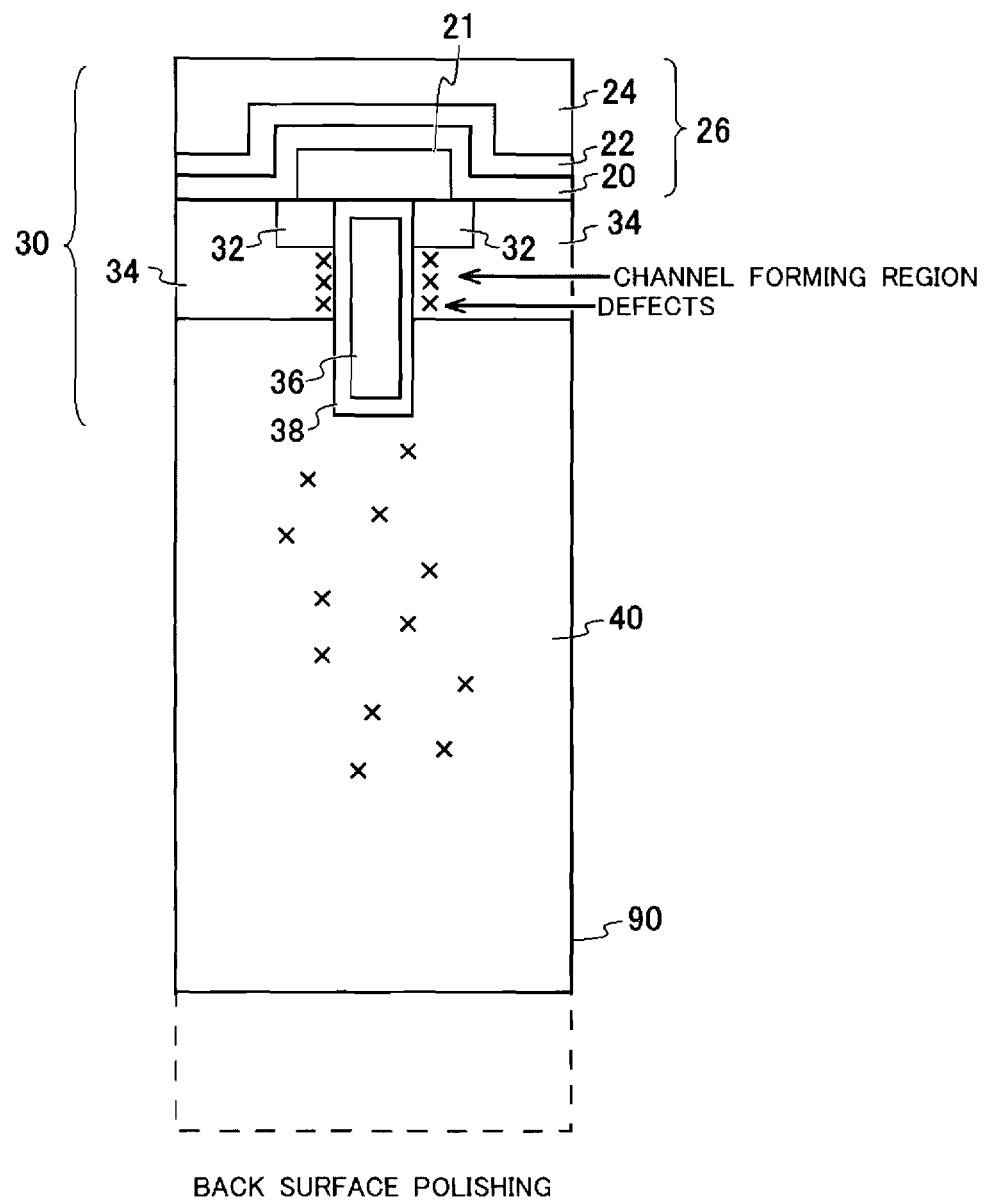
FIG. 5B shows a step of polishing the back surface side of the semiconductor substrate 90.
Figure 5C:
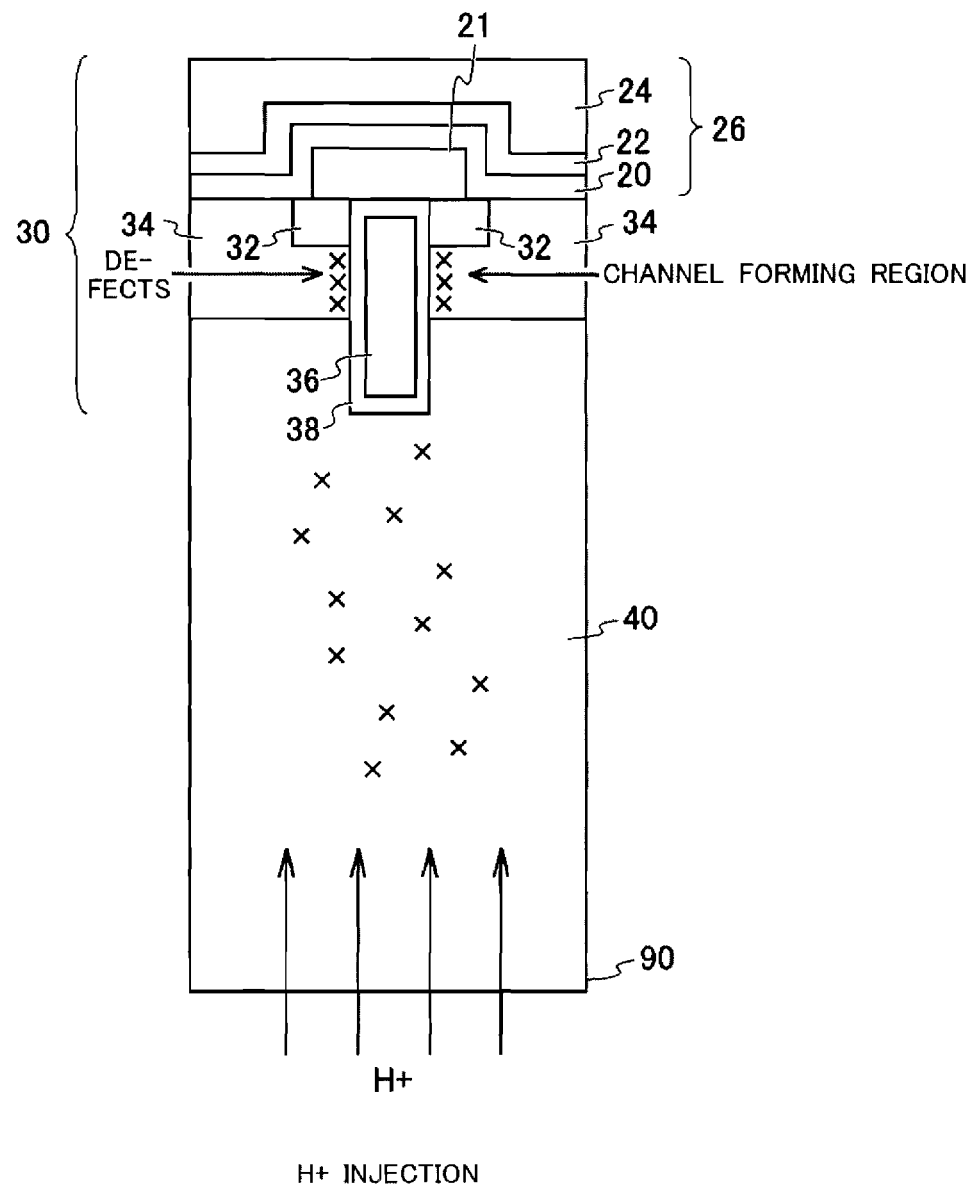
FIG. 5C shows a step of injecting protons from the back surface side of the semiconductor substrate 90.

After this, as shown in FIG. 5B, the back surface side of the semiconductor substrate 90 is polished and thinned. After this, as shown in FIG. 5C, the protons are injected from the back surface side of the semiconductor substrate 90 to form the impurity region. In the same manner as shown in FIG. 2, the proton injection is divided and performed in first to fourth instances. The acceleration voltage is reduced in order from the first instance to the fourth instance to adjust the depth of the proton injection, such that the position of the first instance of proton injection is closest to the front surface side of the semiconductor substrate 90 and the position of the fourth instance of proton injection is closest to the back surface side of the semiconductor substrate 90. The injection amounts per unit area for the first to fourth instances are respectively $N_1$, $N_2$, $N_3$, and $N_4$, and satisfy the relationship of $N_2 < N_1 \approx N_3 < N_4$.

Figure 5D:
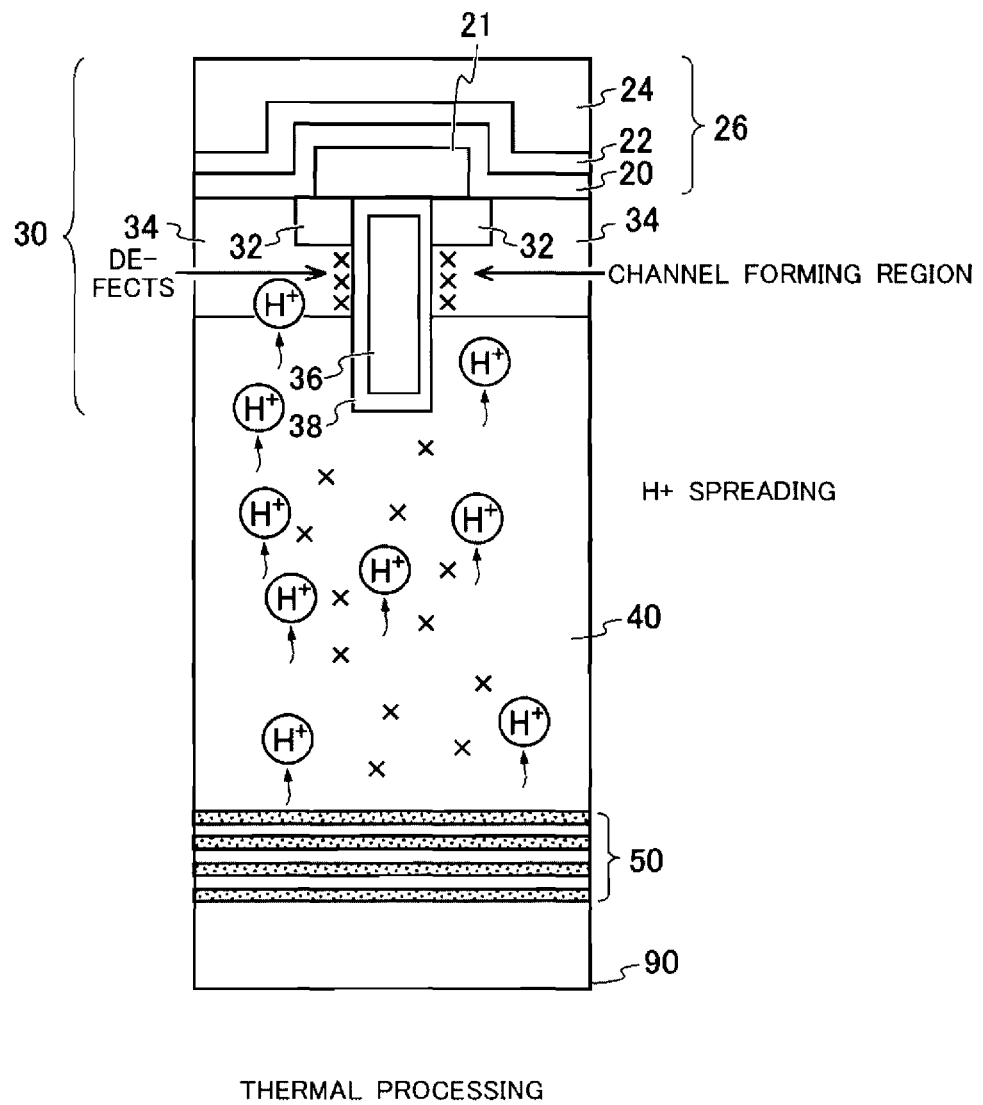
FIG. 5D shows a step of thermally processing the semiconductor substrate 90.

After this, as shown in FIG. 5D, the semiconductor substrate 90 is thermally processed at a temperature from 300° C. to 500° C. for a time from 30 minutes to 10 hours. In the thermal processing step, a portion of the injected protons form VOH defects in the FS layer 50. Furthermore, the other portion of the protons spread through the semiconductor substrate 90 to reach the front surface side, and repair residual defects in the base layer 40 and defects in the channel forming region. The protons are believed to reach to the boundary plane between the gate insulating film 38 and the second conduction type region 34 of the semiconductor substrate 90, and therefore hydrogen atoms may be present at this boundary plane. In other words, the dangling bonds of the silicon of the second conduction type region 34 may be terminated by the protons to form a silicon-hydrogen bond. In this way, it is possible to reduce the leak current when the reverse voltage is applied and to reduce the variation of the gate threshold voltage (Vth).

Figure 5E:
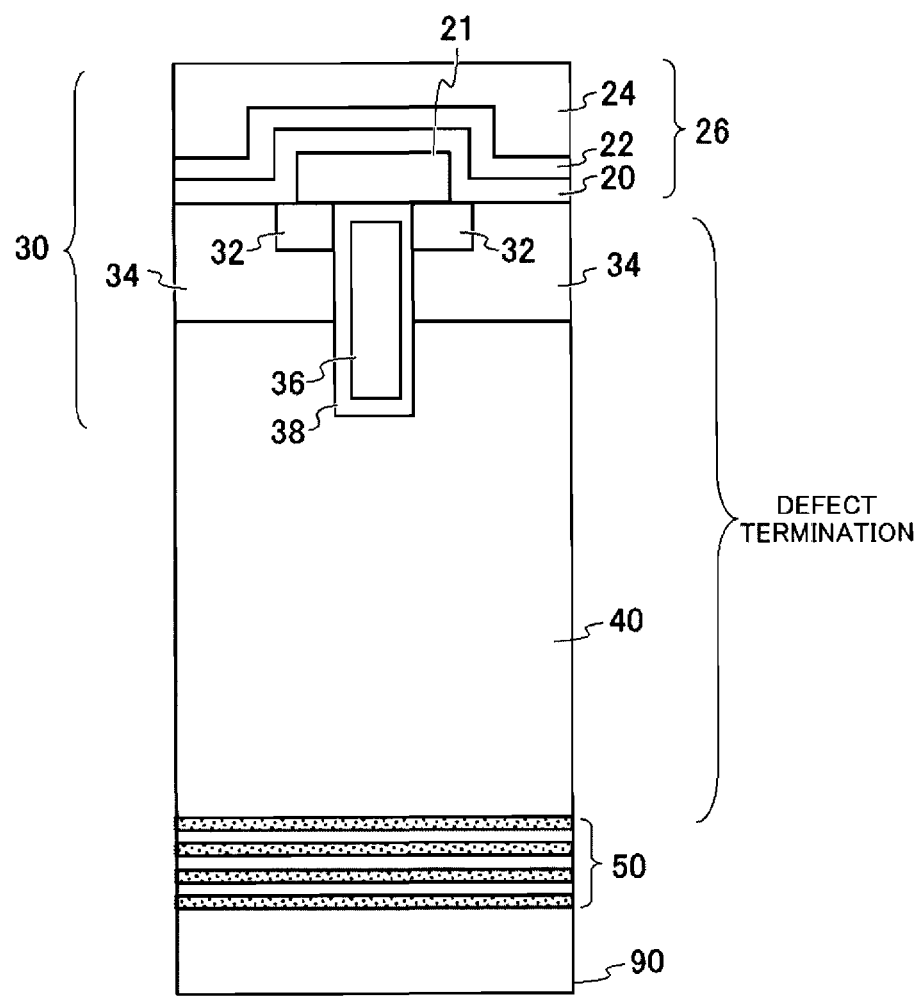
FIG. 5E schematically shows a state in which the defects of the semiconductor substrate 90 have been repaired.
Figure 5F:
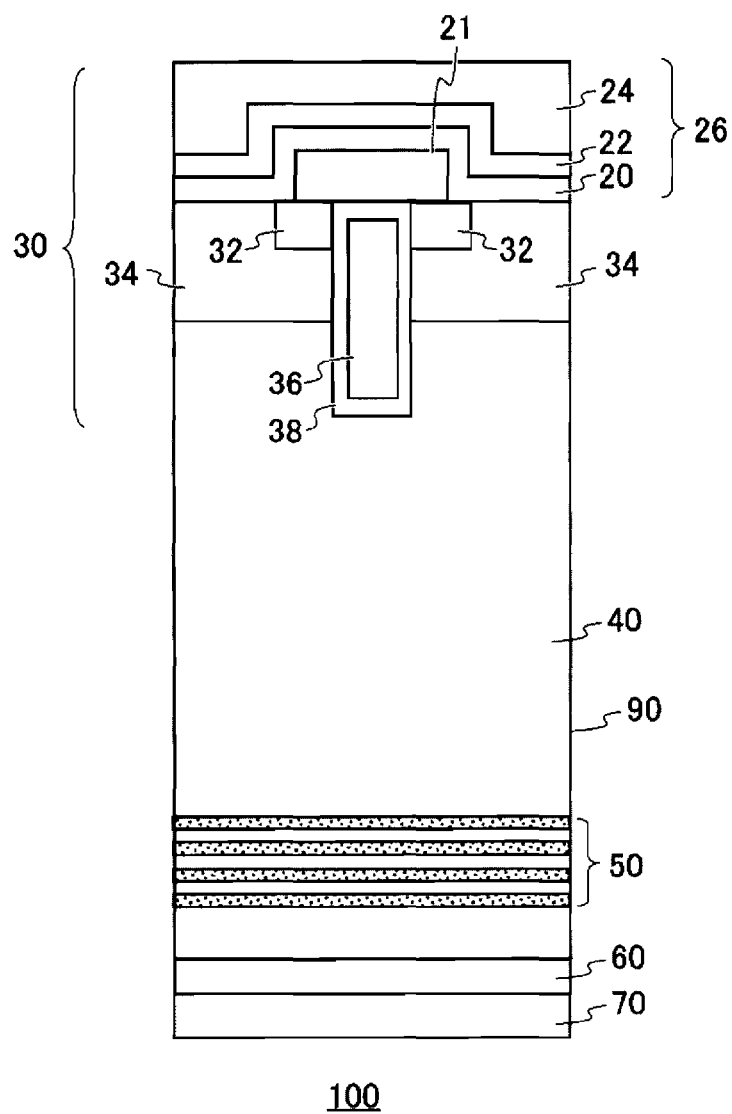
FIG. 5F shows a step of forming the collector layer 60 and the collector electrode 70 on the back surface side of the semiconductor substrate 90.

FIG. 5E schematically shows a state in which the defects of the semiconductor substrate 90 have been repaired. After this, as shown in FIG. 5F, the impurity such as phosphorous is injected into the back surface side of the semiconductor substrate 90 to form the collector layer 60, which is a $p^+$-type silicon layer. Next, the collector electrode 70 is formed on the back surface side of the collector layer 60 by vapor-depositing or sputtering aluminum.

With the present embodiment, proton injection is performed from the back surface side after the barrier metal is formed and then the protons are spread to the front surface side by the thermal processing, and therefore the thermal processing for defect repair needs only be performed once. In other words, there is no need to perform proton injection and thermal processing twice, i.e. from the front surface side and the back surface side. As a result, compared to a case where the proton injection and thermal processing are performed twice, the number of thermal processing steps can be decreased, thereby reducing the manufacturing cost.

Figure 6A:
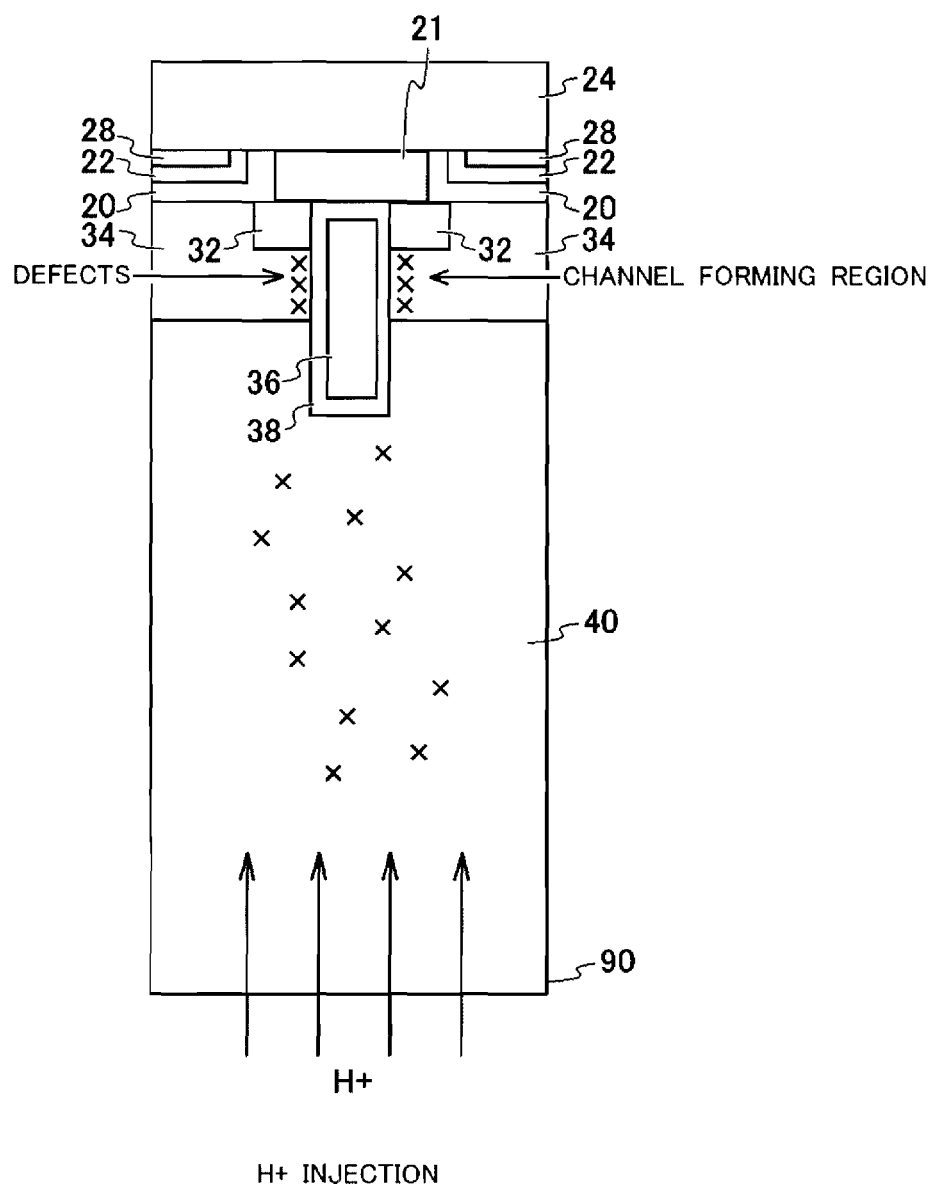
FIG. 6A shows a step of injecting protons from the back surface side of the semiconductor substrate 90.
Figure 6B:
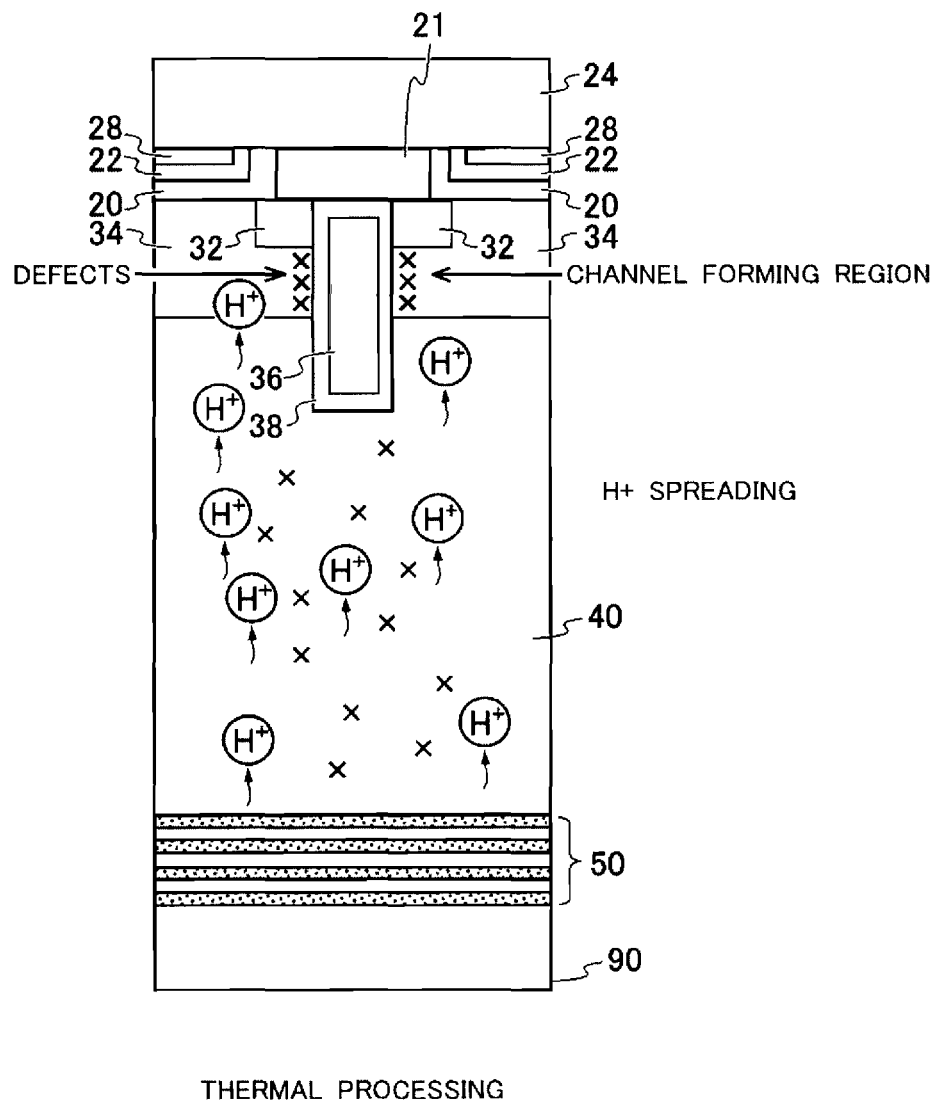
FIG. 6B shows a step of thermally processing the semiconductor substrate 90.
Figure 6C:
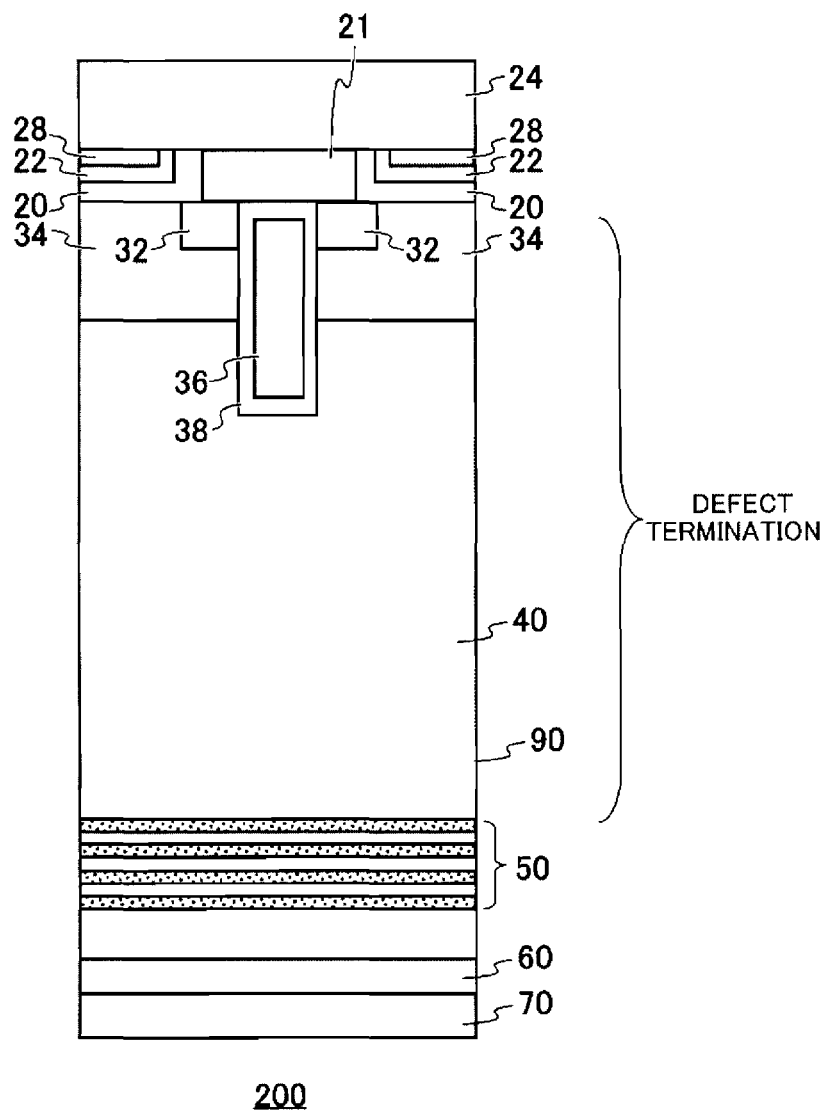
FIG. 6C shows a step of forming the collector layer 60 and the collector electrode 70 on the back surface side of the semiconductor substrate 90, after the defects of the semiconductor substrate 90 have been repaired.

FIGS. 6A to 6C show steps of manufacturing a semiconductor device 200. This example differs from the semiconductor device 100 in that a portion of the first metal nitride layer 22 is not provided, such that there is direct contact between the first metal layer 20 and the second metal layer 24, and a plug 28 is included between the first metal nitride layer 22 and the second metal layer 24. Other portions are the same as the example of the semiconductor device 100. The plug 28 of this example may be a plug 28 made of tungsten. The plug 28 connects the first metal nitride layer 22 to the second metal layer 24. FIG. 6A corresponds to FIG. 5C, and shows the step of injecting the protons from the back surface side of the semiconductor substrate 90. FIG. 6B corresponds to FIG. 5D, and shows the step of thermally processing the semiconductor substrate 90. FIG. 6C corresponds to FIGS. 5E and 5F, and shows the step of forming the collector layer 60 and the collector electrode 70 on the back surface side of the semiconductor substrate 90 after the defects of the semiconductor substrate 90 have been repaired.

In this example as well, proton injection is performed from the back surface side after formation of the MOS gate structure 30, as shown in FIG. 2. In this way, with the semiconductor device 200 adopting the barrier metal, it is possible to reduce the leak current when the reverse voltage is applied and to reduce the variation of the gate threshold voltage (Vth). Furthermore, compared to a case where the proton injection and thermal processing are performed twice, the number of thermal processing steps can be decreased, thereby reducing the manufacturing cost. The usage of the technology recorded in this Specification is not limited to an IGBT. For example, this technology can also be used for an element that performs life time control after formation of the barrier metal.

Figure 7:
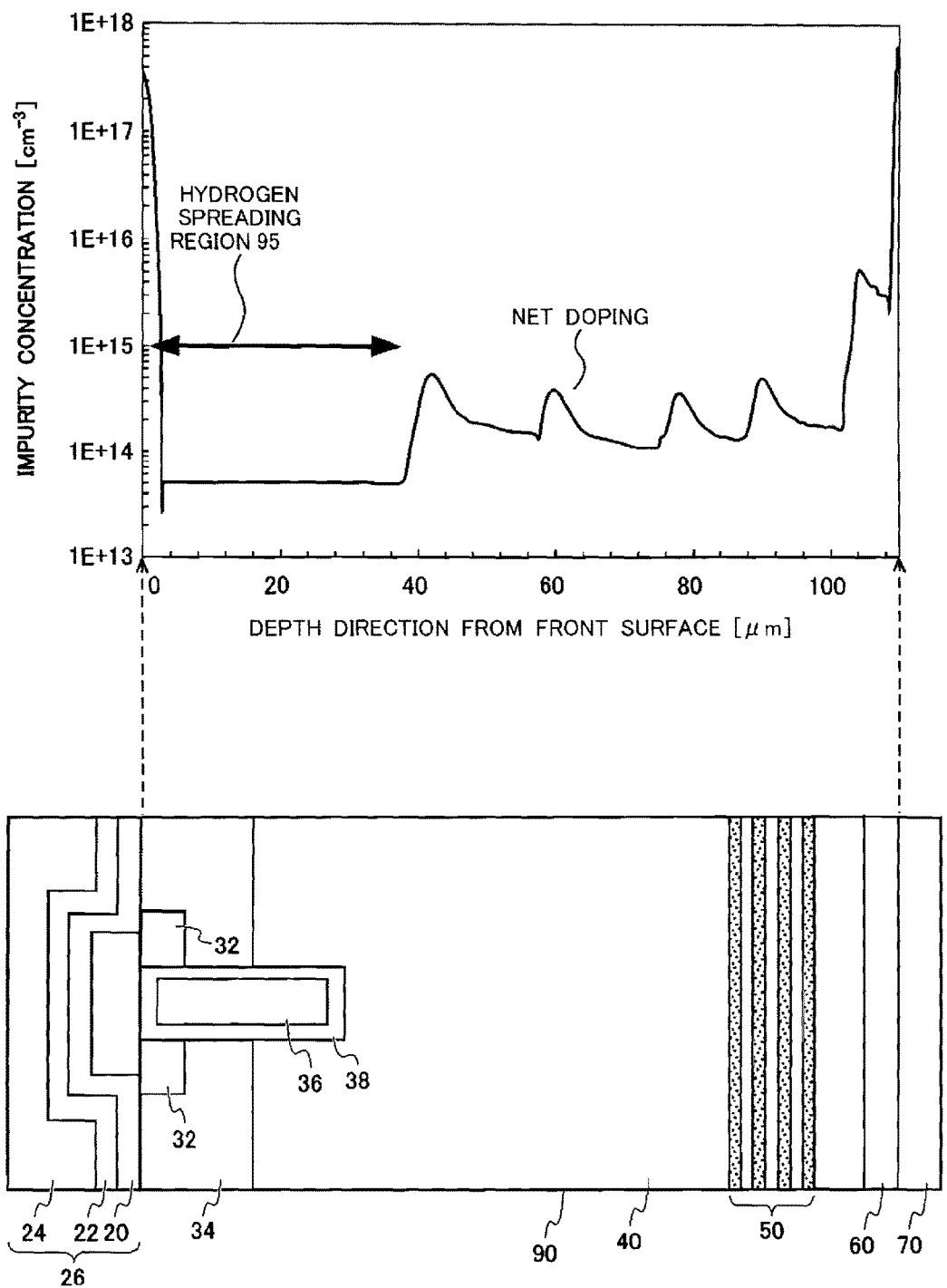
FIG. 7 shows a hydrogen distribution of the semiconductor substrate 90.

FIG. 7 shows a hydrogen distribution of the semiconductor substrate 90. FIG. 7 shows a cross section of the semiconductor device 100 and a net doping concentration distribution of the present embodiment. The semiconductor device 200 may also have the same net doping concentration distribution and hydrogen concentration distribution.

The depth at which the hydrogen is injected is determined by the distance of the deepest protons. On the other hand, as a result of the thermal processing after the proton injection, as shown in FIG. 7, the hydrogen atoms spread tens of micrometers deeper toward the front surface than the distance of the deepest protons. The spreading region is set as a hydrogen spreading region 95. This hydrogen spreading region 95 preferably reaches the channel forming region with a sufficient concentration of hydrogen. For example, the hydrogen concentration in the channel forming region may be greater than or equal to 1E+14 $cm^{-3}$ and have a distribution in which the hydrogen concentration increases in a direction toward the back surface side.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

20: first metal layer, 21: interlayer insulating film, 22: first metal nitride layer, 24: second metal layer, 26: emitter electrode, 28: plug, 30: MOS gate structure, 32: first conduction type region, 34: second conduction type region, 36: gate electrode, 38: gate insulating film, 40: base layer, 50: FS layer, 51: impurity region, 60: collector layer, 70: collector electrode, 90: semiconductor substrate, 95: hydrogen spreading region, 100: semiconductor device, 200: semiconductor device

What is claimed is:

1. A semiconductor device comprising:
    a semiconductor substrate that includes an n-type impurity region containing protons, on a back surface side thereof;
    a p-type impurity region in a front surface side of the semiconductor substrate;
    an n-type second impurity region in the front surface of the semiconductor substrate, and provided in a front surface side of the p-type impurity region;
    a base region that has n-type impurities and is positioned between the p-type impurity region and the n-type impurity region;
    a trench in the front surface side of the semiconductor substrate, the trench directly contacting with the n-type second impurity region, the p-type impurity region and the base region;
    a gate insulating film in an inner wall of the trench;
    a gate electrode inside the gate insulating film;
    a barrier metal that has an effect of shielding from protons, on the front surface side of the semiconductor substrate; and
    an interlayer insulating film to insulate the gate electrode from the barrier metal, wherein
    the n-type impurity region includes:
        a first impurity region that has a predetermined peak carrier concentration;
        a second impurity region that has a peak carrier concentration lower than the predetermined peak carrier concentration and is provided closer to a back surface side than the first impurity region;
        a third impurity region closer to the back surface side than the second impurity region and has a peak carrier concentration higher than the predetermined peak carrier concentration; and
        a fourth impurity region closer to the back surface side than the third impurity region and has a peak carrier concentration higher than the peak carrier concentration of the third impurity region,
    wherein
    hydrogen atoms are present at a boundary plane between the gate insulating film and the semiconductor substrate.

2. The semiconductor device according to claim 1, wherein
    the n-type impurity region has a plurality of peaks in carrier concentration, at positions of different depths between the back surface side and the front surface side.

3. The semiconductor device according to claim 1, wherein
    an integrated value of a carrier concentration from the p-type impurity region to the first impurity region is less than a critical integrated concentration.

4. The semiconductor device according to claim 3, wherein
    a silicon-hydrogen bond is formed at a boundary plane between the gate insulating film and the p-type impurity region.

5. The semiconductor device according to claim 3, wherein
    the first impurity region is between 20 μm and 70 μm from a channel forming region.

6. The semiconductor device according to claim 3, wherein
    the semiconductor substrate has a hydrogen concentration that is greater than or equal to $1E+14$ cm$^{-3}$, from the first impurity region to a channel forming region of the p-type impurity region.

7. The semiconductor device according to claim 3, wherein
    a channel forming region of the semiconductor substrate has a hydrogen concentration that increases in a direction toward the first impurity region.

8. The semiconductor device according to claim 1, wherein the fourth impurity region is provided closest to the back surface side of the semiconductor substrate.

9. A semiconductor device manufacturing method comprising:
    forming a p-type impurity region in a front surface side of a semiconductor substrate;
    forming an n-type second impurity region in the front surface of the semiconductor substrate, and provided in a front surface side of the p-type impurity region;
    forming a trench in the front surface side of the semiconductor substrate, in direct contact with the n-type second impurity region, the p-type impurity region and a base region;
    forming a gate insulating film in an inner wall of the trench;
    forming a gate electrode inside the gate insulating film;
    forming an interlayer insulating film;
    forming a barrier metal that has an effect of shielding from protons, on the front surface side of the semiconductor substrate, and is insulated from the gate electrode by the interlayer insulating film;
    forming an impurity region by injecting protons from a back surface side of the semiconductor substrate; and
    thermally processing the semiconductor substrate into which the protons have been injected, wherein the forming the impurity region includes:
  performing a first instance of proton injection to form a first portion of the impurity region with a predetermined peak carrier concentration;
  performing a second instance of proton injection, which includes changing an injection condition in a manner to make a peak carrier concentration lower than the predetermined peak carrier concentration, to form a second portion of the impurity region closer to the back surface side of the semiconductor substrate than the first portion of the impurity region formed by the first instance of proton injection;
  performing a third instance of proton injection to form a third portion of the impurity region closer to the back surface side of the semiconductor substrate than the second portion of the impurity region formed by the second instance of proton injection and has a peak carrier concentration higher than the predetermined peak carrier concentration; and
  performing a fourth instance of proton injection to form a fourth portion of the impurity region closer to the back surface side of the semiconductor substrate than the third portion of the impurity region formed by the third instance of proton injection and has a peak carrier concentration higher than the peak carrier concentration of the third portion of the impurity region,
wherein
  hydrogen atoms are present at a boundary plane between the gate insulating film and the semiconductor substrate,
  with injection amounts per unit area in the first instance, the second instance, the third instance, and the fourth instance of proton injection set respectively as $N_1$, $N_2$, $N_3$, and $N_4$, a relationship of $N_2<N_1 \approx N_3<N_4$ is satisfied.

10. The semiconductor device manufacturing method according to claim 9, wherein
  the forming the impurity region further includes, while changing injection conditions that include an acceleration voltage and an injection amount per unit area, injecting protons a plurality of times including said first instance of proton injection and said second instance of proton injection at positions of different depths.

11. The semiconductor device manufacturing method according to claim 9, wherein
  the first instance of proton injection is performed after the forming the barrier metal.

12. The semiconductor device manufacturing method according to claim 9, wherein
  the thermally processing the semiconductor substrate into which the protons have been injected is performed after the forming the impurity region by injecting protons from the back surface side of the semiconductor substrate.

13. The semiconductor device manufacturing method according to claim 9,
  wherein the barrier metal is formed after the interlayer insulating film is formed.

14. The semiconductor device manufacturing method according to claim 9, wherein the performing the fourth instance of proton injection forms the fourth portion of the impurity region closest to the back surface side of the semiconductor substrate.

15. The semiconductor device manufacturing method according to claim 9, wherein a peak injection amount per unit area $N_1$ in the first instance of proton injection satisfies the relationship $$1E+12/cm^2 <= N_1 <= 1E+14/cm^2.$$

* * * * *